US009798254B2

United States Patent
Hauf (10) Patent No.: US 9,798,254 B2
(45) Date of Patent: Oct. 24, 2017

(54) ARRANGEMENT FOR THE THERMAL ACTUATION OF A MIRROR, IN PARTICULAR IN A MICROLITHOGRAPHIC PROJECTION EXPOSURE APPARATUS

(71) Applicant: Carl Zeiss SMT GmbH, Oberkochen (DE)

(72) Inventor: Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 94 days.

(21) Appl. No.: 14/848,593

(22) Filed: Sep. 9, 2015

(65) Prior Publication Data

US 2016/0041480 A1    Feb. 11, 2016

Related U.S. Application Data (63) Continuation of application No. PCT/EP2014/054487, filed on Mar. 7, 2014.
(Continued)

(30) Foreign Application Priority Data

Mar. 14, 2013 (DE) .................. 10 2013 204 427

(51) Int. Cl.
G03B 27/42    (2006.01)
G03B 27/52    (2006.01)
(Continued)

(52) U.S. Cl.
CPC ......... *G03F 7/70891* (2013.01); *G02B 7/181* (2013.01); *G02B 26/0825* (2013.01); *G03F 7/70266* (2013.01); *G03F 7/70883* (2013.01)

(58) Field of Classification Search
CPC ............ F28D 15/00; F28D 2021/0028; F28D 2020/0078; F28D 20/00; F28D 21/0001; F28D 1/0246; F28D 20/003; F28D 21/00; F28D 2021/0019; F28D 2021/0031; F28D 2021/0077; F28D 20/0056; F28D 9/0093; H01L 23/473; H01L 23/34; H01L 23/3675; H01L 23/373
See application file for complete search history.

(56) References Cited

U.S. PATENT DOCUMENTS 7,740,362 B1    6/2010  Neil et al.
8,508,854 B2    8/2013  Eva et al.
(Continued)

FOREIGN PATENT DOCUMENTS

CN          101641645       2/2010
DE   10 2009 024 118 A1    2/2010
(Continued)

OTHER PUBLICATIONS

International Search Report and Written Opinion for International Patent Appln No. PCT/EP2014/054487 dated Sep. 15, 2014.
(Continued)

*Primary Examiner* — Mesfin Asfaw
(74) *Attorney, Agent, or Firm* — Fish & Richardson P.C.

(57) ABSTRACT

The disclosure provides an arrangement for the thermal actuation of a mirror, in particular in a microlithographic projection exposure apparatus, as well as related methods and systems.

27 Claims, 8 Drawing Sheets

Related U.S. Application Data (60) Provisional application No. 61/781,280, filed on Mar. 14, 2013.

(51) Int. Cl.
  *G03F 7/20* (2006.01)
  *G02B 7/18* (2006.01)
  *G02B 26/08* (2006.01)

(56) References Cited

U.S. PATENT DOCUMENTS

| | | |
|---|---|---|
| 2004/0051984 A1 | 3/2004 | Oshino et al. |
| 2008/0170310 A1 | 7/2008 | Mann |
| 2008/0225252 A1 | 9/2008 | Oudshoorn et al. |
| 2010/0033704 A1 | 2/2010 | Shiraishi |
| 2011/0051267 A1 | 3/2011 | Kierey et al. |
| 2011/0176121 A1 | 7/2011 | Loopstra et al. |
| 2011/0249245 A1* | 10/2011 | Janssen ............... F28D 15/00 355/30 |
| 2013/0176544 A1 | 7/2013 | Hauf et al. |
| 2014/0071523 A1 | 3/2014 | Hartjes et al. |

FOREIGN PATENT DOCUMENTS

| | | |
|---|---|---|
| DE | 10 2009 039 400 A1 | 3/2011 |
| DE | 10 2011 081 259 A1 | 3/2012 |
| DE | 10 2011 005 778 A1 | 9/2012 |
| DE | 10 2011 005 840 A1 | 9/2012 |
| EP | 1 376 192 A2 | 1/2004 |
| WO | WO 2008/034636 A2 | 3/2008 |
| WO | WO 2009/026970 A1 | 3/2009 |
| WO | WO 2009/046955 | 4/2009 |
| WO | WO 2009/046955 A2 | 4/2009 |
| WO | WO 2009/152959 A1 | 12/2009 |
| WO | WO 2010/018753 A1 | 2/2010 |
| WO | WO 2012/013746 | 2/2012 |
| WO | WO 2012/041744 A1 | 4/2012 |
| WO | WO 2012/126803 A1 | 9/2012 |

OTHER PUBLICATIONS

Chinese Office Action and English translation thereof, for corresponding CN Appl. No. 201480014966.9, dated Nov. 8, 2016, 16 pages.

German Office Action, with translation thereof, for corresponding DE Appl No. 10 2013 204 427.5, dated Dec. 23, 2013.

International Preliminary Report on Patentabililty for corresponding PCT Appln No. PCT/EP2014/054487, dated Sep. 24, 2015.

* cited by examiner

ARRANGEMENT FOR THE THERMAL ACTUATION OF A MIRROR, IN PARTICULAR IN A MICROLITHOGRAPHIC PROJECTION EXPOSURE APPARATUS

CROSS REFERENCE TO RELATED APPLICATIONS

This application is a continuation of, and claims benefit under 35 USC 120 to, international application PCT/EP2014/054487, filed Mar. 7 2014, which claims priority of German Patent Application DE 10 2013 204 427.5 and U.S. 61/781,280, both filed on Mar. 14, 2013. The content of these applications is hereby incorporated by reference.

BACKGROUND OF THE INVENTION

Field of the Invention

The invention concerns an arrangement for the thermal actuation of a mirror, in particular in a microlithographic projection exposure apparatus.

Microlithography is used for the production of microstructured components, such as for example integrated circuits or LCDs. The microlithographic process is carried out in what is known as a projection exposure apparatus, which has an illumination device and a projection lens. The image of a mask (=reticle) illuminated via the illumination device is thereby projected via the projection lens onto a substrate (for example a silicon wafer) that is coated with a light-sensitive layer (photoresist) and is arranged in the image plane of the projection lens, in order to transfer the mask structure to the light-sensitive coating of the substrate.

In projection lenses designed for the EUV range, i.e. at wavelengths of, for example, approximately 13 nm or approximately 7 nm, mirrors are used as optical components for the imaging process because of the lack of availability of suitable light-transmissive refractive materials. A problem that arises in practice is that, in particular as a result of absorption of the radiation emitted by the EUV light source, the EUV mirrors undergo heating and an accompanying thermal expansion or deformation, which in turn may have the consequence of impairing the imaging properties of the optical system. At the same time, because of the use of special illumination settings (such as for example dipole or quadrupole settings) in the lithography process and because of the orders of diffraction caused by the reticle, the heat inputs brought about by the EUV radiation can be varied over the optically effective cross section of mirrors close to the pupil, so that an inhomogeneous heat input into the mirror takes place.

To be able to compensate for these effects should they occur, but also for specifically changing the optical properties of a mirror, for example to compensate for aberrations occurring in the system, it is known to control the mirror deformation by way of a thermal actuation. Proposed ways of carrying out mirror temperature measurement and/or actuation of a mirror or the specific deformation thereof are known, for example, from WO 2010/018753 A1, US 2004/0051984 A1, WO 2008/034636 A2, DE 10 2009 024 118 A1, WO 2009/046955 A2 and WO 2012/041744 A1.

A problem that arises in practice in the thermal actuation or deformation of a mirror is that, on the one hand, for the introduction of deformations into the mirror substrate material by way of thermal expansion or contraction, there must in principle be sufficient sensitivity of the mirror substrate material to thermal loads but, on the other hand, sensitivities to the optical loads, and the associated temperature effects, occurring during the "normal" operation of the projection exposure apparatus, are desired. In other words, without further measures in the design of the mirror to obtain an increasing sensitivity to thermal loads introduced for the purpose of producing deformation, there is an increasing occurrence of thermally induced aberrations during the operation of the projection exposure apparatus as a result of the unavoidable optical loads due to the (for example EUV) radiation that is used.

SUMMARY OF THE INVENTION

An object of the present invention is to provide an arrangement for the thermal actuation of a mirror in an optical system that makes efficient thermal actuation possible with at the same time low sensitivity to the optical loads occurring during normal operation.

This object is achieved by an arrangement for the thermal actuation of a mirror in an optical system, in particular in a microlithographic projection exposure apparatus. The mirror has a mirror substrate and an optically effective surface and also at least one access channel extending from a surface of the mirror not corresponding to the optically effective surface in the direction of this effective surface. A cooling element with a cooling power that can be set variably protrudes into the at least one access channel. At least one heat source for coupling heating power that can be set variably into a region of the mirror substrate that is adjoining the optically effective surface is provided. By setting the cooling power of the cooling element and the heating power of the at least one heat source, a thermal flux between the optically effective surface and the surface of the mirror not corresponding to the optically effective surface is achievable. The thermal flux results in a temperature gradient and a related local variation of a value of the coefficient of thermal expansion in the mirror substrate.

According to one aspect of the invention, the invention concerns an arrangement for the thermal actuation of a mirror in an optical system, in particular in a microlithographic projection exposure apparatus, the mirror having a mirror substrate and an optically effective surface and also at least one access channel extending from a surface of the mirror not corresponding to the optically effective surface in the direction of this effective surface, wherein a cooling element with a cooling power that can be set variably protrudes into the at least one access channel, and wherein at least one heat source for coupling heating power that can be set variably into a region of the mirror substrate that is adjoining the optically effective surface is provided;

wherein by setting the cooling power of the cooling element and the heating power of the at least one heat source, a thermal flux between the optically effective surface and the surface of the mirror not corresponding to the optically effective surface is achievable, the thermal flux resulting in a temperature gradient and a related local variation of a value of the coefficient of thermal expansion in the mirror substrate.

The invention is based in particular on the concept of using cooling elements that are variable with regard to their cooling power in combination with a heat source that can be set variably with regard to its heating power to provide two degrees of freedom in the thermal actuation that can be set independently of one another in terms of automatic control. This creates the possibility of setting a temperature profile that forms over the mirror or the mirror substrate in such a way that, on the one hand, the region of the mirror substrate that is in the direct vicinity of the optically effective surface or the reflective coating present there and is exposed to unavoidable optical loads during the operation of the optical system or the projection exposure apparatus because of the electromagnetic (for example EUV) radiation impinging on the optically effective surface has only a comparatively low or even entirely negligible thermal sensitivity, for the reason that what is known as the "zero-crossing temperature" is set in this region close to the optically effective surface. At this zero-crossing temperature, the coefficient of thermal expansion has a zero crossing in its temperature dependence, around which there is no thermal expansion, or only negligible thermal expansion, of the mirror substrate material.

On the other hand, because of the aforementioned provision of two parameters or degrees of freedom that can be set independently of one another in terms of automatic control, an entirely different temperature (than in the vicinity of the optically effective surface) can be set in the region of the mirror substrate material that is more remote from the optically effective surface, a temperature at which a comparatively greater sensitivity to thermal loads is obtained for the material concerned, as is desired for specific thermal actuation or deformation.

With other words, the present invention is based in particular on the concept of creating, using the independently realizable adjustability of the cooling power of a cooling element on the one hand and the heating power of at least one heat source on the other hand, a thermal flux between the optically effective surface and the surface of the mirror not corresponding to the optically effective surface (e.g. the backside of the mirror). This thermal flux results in a temperature gradient and a related local variation of a value of the coefficient of thermal expansion in the mirror substrate, which leads to a behaviour of the mirror substrate being comparable, in terms of thermal sensitivity or the locally varying coefficient of thermal expansion (CTE), to a bimetal. More specifically, this behaviour makes it possible to maintain the optically effective surface of the mirror at a temperature for which the mirror material is substantially insensitive against thermal loads occurring during operation of the optical system (namely the so-called zero crossing temperature explained below in more detail), while at the same time enabling a region in the mirror substrate remote from the optically effective surface to be more sensitive or thermally actuable due to the different CTE-value in order to create a desired specific deformation of the mirror. By this concept, the invention also circumvents or avoids the conflicting aspects that an actuator, which is desired to be insensitive against thermal loads, will also behave insensitive against thermal actuation.

In particular when there is, for example, an increase in the optical loads occurring during the operation of the optical system, and for the purpose of maintaining the zero-crossing temperature in the direct vicinity of the optically effective surface of the mirror, the heating power of the heat source may be reduced—with unchanged cooling power of the cooling element—, with the consequence that the thermal balance in the direct vicinity of the optically effective surface is preserved, whereas an efficient thermal actuation or deformation can take place in the region remote from the optically effective surface that is at a temperature well below the zero-crossing temperature, as a result of the greater, and no longer negligible, coefficient of linear expansion in this remote region.

As a result, by suitable combination of the heating power of the heat source, on the one hand, and the cooling power of the cooling element, which can likewise be set variably, on the other hand, the temperature in the region remote from the optically effective surface can be specifically manipulated at any time, while the temperature in the direct vicinity of the optically effective surface is kept substantially constant (that is preferably at the aforementioned zero-crossing temperature). As a consequence of the sensitivity to changes in temperature that there consequently is in the region remote from the optically effective surface, mirror deformations can be generated there, while at the same time in the region of the optically effective surface the mirror remains largely insensitive to the impinging electromagnetic radiation of unavoidable optical loads occurring during the operation of the optical system.

According to one embodiment, the arrangement has a plurality of access channels. In this respect, each of these access channels may in particular be respectively assigned a cooling element, the cooling elements preferably being able to be set independently of one another in their cooling power.

According to one embodiment, the at least one cooling element has a tubular geometry.

According to one embodiment, the heat source has at least one heat emitter for coupling heating radiation into the at least one access channel. Furthermore, each of the access channels may be respectively assigned a heat emitter, the heat emitters preferably being able to be set independently of one another in their heating power. Furthermore, the at least one heat emitter may be arranged in the end portion of the access channel that is facing the optically effective surface. However, the invention is not restricted to this, so that in other embodiments the heat emitter may, for example, also be arranged in the region of the rear side of the mirror, in order to couple in the heating radiation by way of reflection along the access channel (preferably with what is known as a "grazing incidence").

The heating radiation may, for example, have a wavelength of at least 2.5 μm, in particular at least 5 μm.

In other embodiments, the heat source may also have at least one heating wire or at least one heat-dissipating conductor track (for example in the form of a structured electrically conducting layer), which is arranged between the mirror substrate and the reflective coating of the mirror.

According to one embodiment, the access channel extends from the surface of the mirror that is opposite from the optically effective surface in the direction of the optically effective surface.

According to one embodiment, the mirror has a first mirror substrate region of a first mirror substrate material and a second mirror substrate region of a second mirror substrate material, different from the first mirror substrate material, the second mirror substrate region being more remote from the optically effective surface of the mirror than the first mirror substrate region. In this respect, the first mirror substrate material preferably has a lower coefficient of linear expansion at a prescribed temperature than the second mirror substrate material.

As a result of this configuration, the described greater sensitivity of the mirror substrate material that is desired for the purpose of specific deformation is obtained in the region more remote from the optically effective surface not only because of the temperature gradient forming within the mirror substrate material but also because of the transition between different mirror substrate materials, which is of advantage in particular whenever the temperature gradient forming in the mirror substrate alone is not yet sufficient to achieve the sensitivity to thermal loads desired for the deformation while at the same time maintaining the zero-crossing temperature at the optically effective surface.

According to one embodiment, the first mirror substrate material is a material with ultra-low thermal expansion "ultra-low expansion material", for example a titanium-silicate glass sold under the name ULE™ by the company Corning Inc. Furthermore, the second mirror substrate material may, for example, be amorphous or crystalline quartz ($SiO_2$).

According to one embodiment, the mirror has a reflective coating, an absorbent layer for the absorption of heating radiation that is coupled into the access channel being arranged between the mirror substrate and the reflective coating.

The invention also concerns a method for the thermal actuation of a mirror, in particular in a microlithographic projection exposure apparatus, the mirror having a mirror substrate, an optically effective surface and at least one access channel extending from a surface of the mirror not corresponding to the optically effective surface in the direction of this effective surface and also a cooling element with a cooling power that can be set variably protruding into the at least one access channel,
- wherein, by way of at least one heat source, heating power is coupled into a region of the mirror substrate that is adjoining the optically effective surface, and
- wherein, by variation of this heating power of the heat source and/or the cooling power of the cooling element, a defined deformation profile of the mirror is produced;
- wherein the variation of the heating power of the heat source and/or the cooling power of the cooling element is performed in such a way that the temperature of the mirror in the region of the optically effective surface is kept at a constant value to within ±3 Kelvin (K).

This constant value preferably corresponds to the zero-crossing temperature of the mirror substrate material in the region concerned. According to one embodiment, the constant value lies, for example, in the range of 22° C. to 55° C., in particular in the range of 22° C. to 40° C.

According to one embodiment, the variation of the heating power of the heat source may be performed in such a way that a heat input into the optically effective surface that is caused by optical loads during the operation of the projection exposure apparatus is at least partially compensated. In this way, the temperature of the optically effective surface can be kept constant even under variable optical loads.

According to an embodiment, by a temperature variation in a region of the mirror substrate facing away from the optically effective surface a deformation in that region of the mirror substrate facing away from the optically effective surface is effected, wherein the deformation mechanically transfers to the optically effective surface.

For further preferred configurations or advantages of the method, reference is made to the statements made above in conjunction with the arrangement according to the invention.

Further configurations of the invention can be taken from the description and the subclaims.

BRIEF DESCRIPTION OF THE DRAWINGS

The invention is explained in more detail below on the basis of preferred exemplary embodiments that are represented in the accompanying figures, in which.

DETAILED DESCRIPTION OF PREFERRED EMBODIMENTS

An arrangement for the thermal actuation of a mirror is explained below initially with reference to FIG. 1 and FIG. 2a-b on the basis of a first embodiment of the invention.

Figure 1:
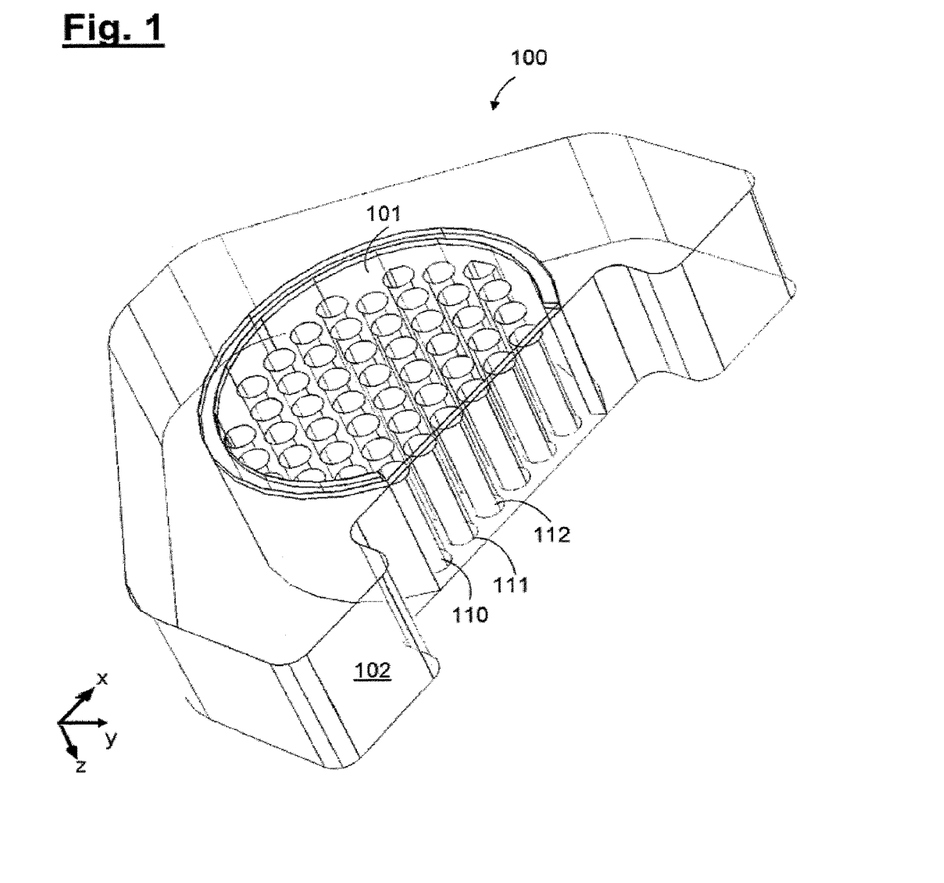
FIGS. 1-2 show schematic representations for explaining the structure of an arrangement according to the invention for the thermal actuation of a mirror in a first embodiment of the invention.

According to the perspective schematic representation of FIG. 1, the mirror 100 has a plurality of access channels 110, 111, 112, . . . , which extend from the rear side of the mirror (i.e. the side of the mirror 100 that is opposite from the optically effective surface 101) through the mirror substrate denoted by "102" into the vicinity of the optically effective surface 101, the access channels 110, 111, 112, . . . according to FIG. 1 being in a matrix-like arrangement. In FIG. 2a-b, only one access channel 110 is shown in section, the mirror 100 and the other access channels 111, 112, . . . being configured in an analogous way. On the optically effective surface 101 of the mirror 100 or the mirror substrate 102 there is a reflective coating (not represented).

Figure 2:
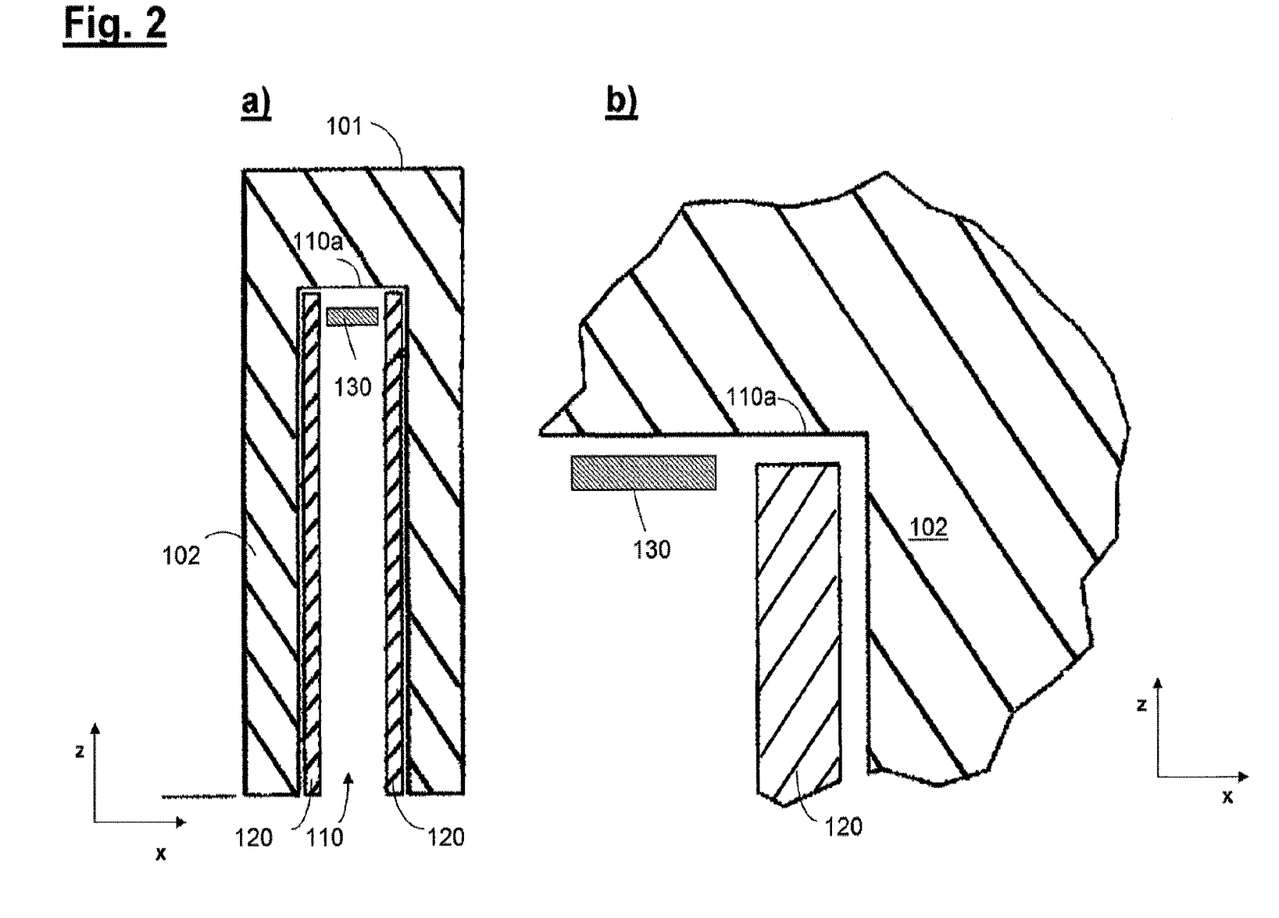

FIGS. 1 and 2, and similarly the further figures too, respectively represent schematic illustrations that are not to scale, it being possible for dimensions that are given merely by way of example of the access channel 110 (without restricting the invention to them) to comprise a diameter of the respective bores in the range of 5 to 30 mm and also a distance of the respective end faces 110a from the optically effective surface 101 in the range of likewise 5 to 30 mm. Typical thicknesses of the mirror 100 itself (likewise merely by way of example and without restricting the invention) lie, for example, in the range of approximately 50 to 120 mm.

As can be seen best from FIG. 2a, a cooling element 120 of a tubular geometry in the exemplary embodiment extends into the access channel 110, this cooling element 120 being able to be set variably in its cooling power (by connection to a controllable cooler that is not shown). As likewise indicated in FIG. 2a-b, the arrangement also has a heat source in the form of a heat emitter 130, which in the exemplary embodiment is arranged in the end portion of the access channel 110 that is facing the optically effective surface 101 and has a heating power that can likewise be set variably. In further embodiments, the heat emitter 130 may also be arranged in a different region of the access channel 110, in particular also in the region of the rear side of the mirror, in order in this case to couple in the heating radiation by way of the access channel 110 or reflection on the side walls of the access channel 110, preferably sufficiently shallow reflection angles with what is known as "grazing incidence". Furthermore, as explained in still more detail below, the heat source may also be configured in the form of at least one heating wire.

The electromagnetic radiation that is radiated—once again with reference to FIGS. 1 and 2a,b—by way of the heat emitter 130 and coupled into the mirror substrate material may, for example, have a wavelength of at least 2.5 µm, more particularly a wavelength of at least 5 µm, as may be realized for instance by way of what is known as a low-temperature emitter at temperatures of up to 400° C., in particular in the range up to 200° C. In other exemplary embodiments, a high-temperature emitter, such as for example a spiral-wound filament (with an operating temperature of typically up to 3000° C.) may also be used.

The arrangement chosen in FIG. 2a-b of the cooling element 120, on the one hand, and the heat source or heat emitter 130, on the other hand, achieves the effect in particular that the heat transfer from the mirror substrate material to the cooling element 120 (set to a temperature of T=−20° C.) takes place substantially along the entire surface of the access channel 110, whereas the coupling of heating radiation (for example infrared radiation) by way of the heat emitter 130 into the mirror substrate material takes place substantially only in the end portion of the access channel 110 containing the end face 110a. The combined use of the cooling element 120, on the one hand, and the heat emitter 130, on the other hand, allows the temperature of the mirror substrate material in the region of the optically effective surface 101 to be kept constantly at a value that corresponds substantially to the zero-crossing temperature of the mirror substrate material concerned (for example when there is an increasing optical load in the region of the optically effective surface 101 as a result of the impinging electromagnetic (EUV) radiation during the operation of the projection exposure apparatus). Conversely, independently of the thermal balance maintained in the region of the optically effective surface 101, a temperature that deviates from the zero-crossing temperature and makes sufficient sensitivity of the mirror substrate material to thermal loads possible, and consequently specific thermal actuation or deformation of the mirror 100, can be set in a region remote therefrom (that is in the "lower" region in FIG. 2a-b).

Merely by way of example (and without restricting the invention to this), the temperature set in the region of the optically effective surface 101 may be 30° C. and in the region remote from the optically effective surface 101 may be −15° C., in which case there is already a significant change in the coefficient of linear expansion depending on the mirror substrate material.

Figure 7:
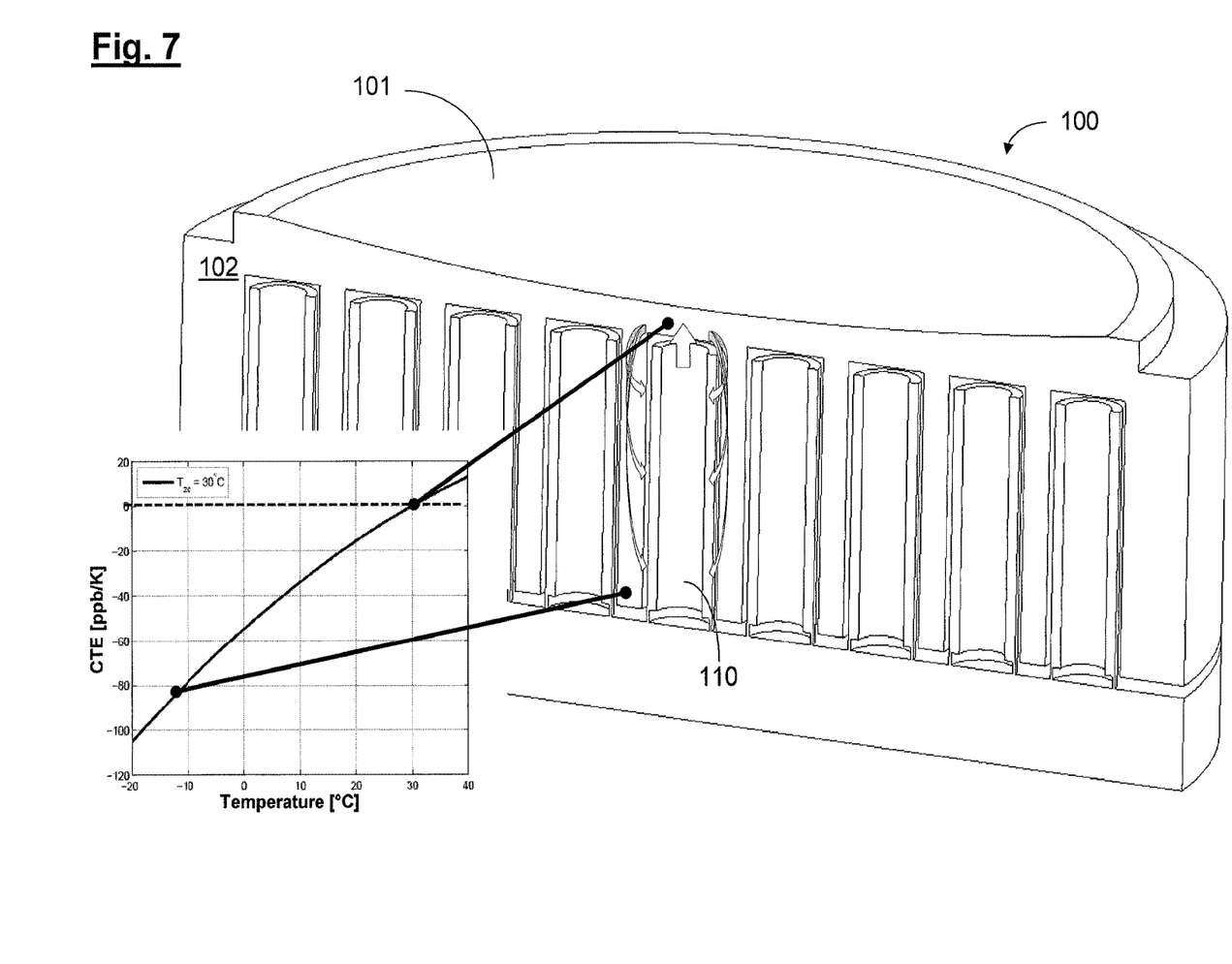
FIG. 7 shows a schematic representation illustrating a concept of the present invention.

The inventive concept in particular involves creating, using the independently realizable adjustability of the cooling power of a cooling element on the one hand and the heating power of at least one heat source on the other hand, a thermal flux between the optically effective surface and the surface of the mirror not corresponding to the optically effective surface (e.g. the backside of the mirror). This thermal flux results in a temperature gradient and a related local variation of a value of the coefficient of thermal expansion in the mirror substrate, which leads to a behaviour of the mirror substrate being comparable, in terms of thermal sensitivity or the varying coefficient of thermal expansion (CTE), to a bimetal. This concept is also schematically illustrated in FIG. 7 (where components or parts being analogous to FIG. 1 have same reference numbers). As shown in FIG. 7, the thermal flow along e.g. the access channel 110 and the created temperature gradient between the optically effective surface 101 and the backside of the mirror 100 makes it possible to maintain the optically effective surface 101 of the mirror 100 at a temperature for which the mirror material is substantially insensitive against thermal loads occurring during operation of the optical system (namely the so-called zero crossing temperature), while at the same time enabling a region in the mirror substrate remote from the optically effective surface to be more sensitive or thermally actuable due to the different CTE-value in order to create a desired specific deformation of the mirror.

According to an aspect of the invention, a temperature variation is created in a region of the mirror substrate facing away from the optically effective surface (e.g. at the backside of the mirror) such that, due to the thermal sensitivity achieved by the value of the coefficient of thermal expansion in that region of the mirror substrate, a deformation in the mirror substrate is effected, the deformation being mechanically transferred to the optically effective surface (having a substantially constant temperature close to the zero crossing temperature).

By superposing all of the basic functions of the cooling elements 120, desired deformation profiles can be set. This is a non-linear optimization problem (because of the proximity to the "zero-crossing point" of the coefficient of linear expansion), the resolution of which can be obtained numerically by iteratively carrying out the following steps:

a) generating a pattern of holes;
b) calculating the impact matrix for the surface temperature and surface deformation for the temperature operating point;
c) determining the individual heating and cooling power, so that, according to the linear calculation, the desired deformation profile is obtained under the secondary condition that the temperature distribution is kept close to the zero-crossing temperature over the optically effective surface;
d) determining the actual deformation profile via non-linear calculation; and
e) changing the temperature profile to correct the deformation profile deviation according to the linear calculation.

In FIG. 2c-f, the result of the calculation of the impact matrices is shown merely by way of example in the form of contour diagrams for a cooling element and the associated access channel, FIG. 2c showing the profile $dT/dq_f$, FIG. 2d showing the profile $dw/dq_f$, FIG. 2e showing the profile $dT/dT_f$, and FIG. 2f showing the profile $dw/dT_f$, where w denotes the z deformation (=deformation in the z direction), where q denotes the thermal flow and T denotes the temperature. As described above, the corresponding impact matrices (and the resultant temperature base functions and deformation base functions) can be suitably combined to set a desired (as homogeneous as possible) temperature profile and also a desired deformation profile.

By repeatedly or iteratively carrying out steps d) and e), the achieved deviation in the deformation becomes smaller. In this respect, for example, deformations of the order of magnitude of ±0.5 nm are achievable.

Figure 3:
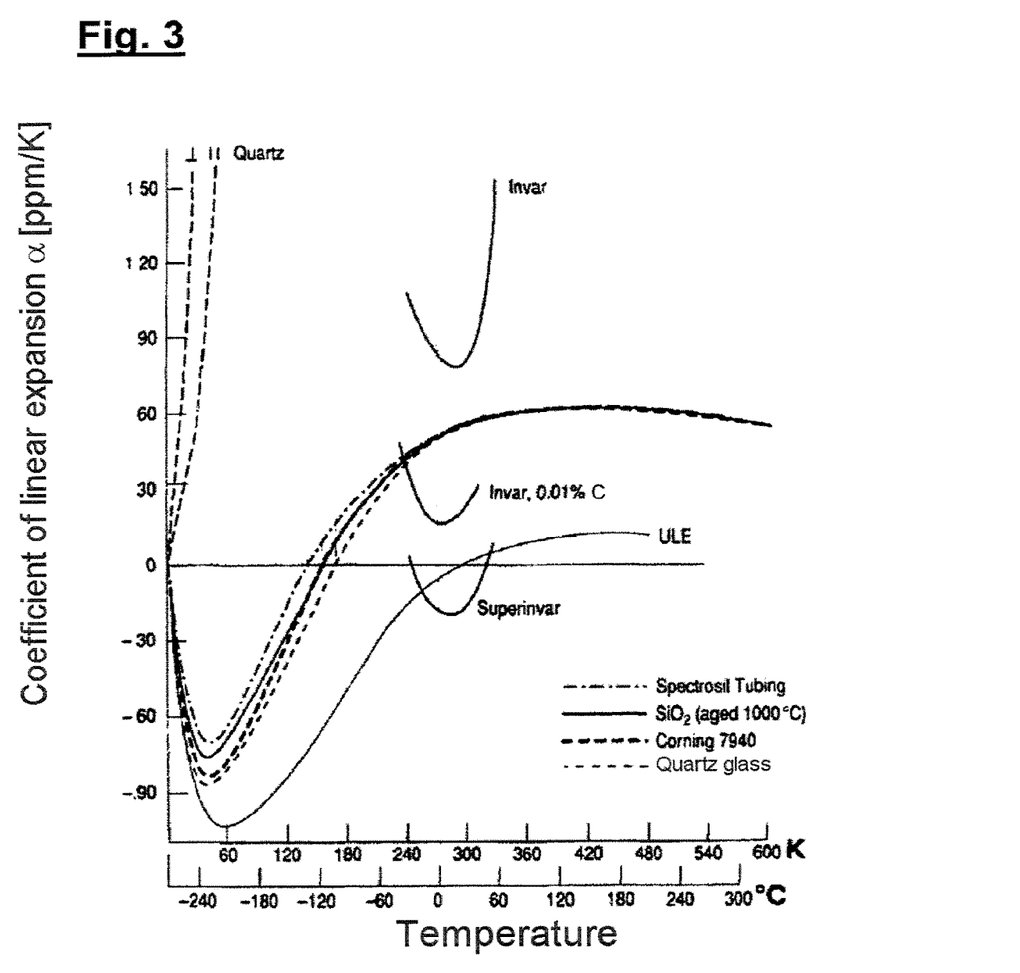
FIG. 3 shows a diagram in which the temperature dependence of the coefficient of linear expansion for different mirror substrate materials is plotted.

FIG. 3 shows a diagram in which the coefficient of linear expansion for different mirror substrate materials is plotted in dependence on the temperature. The zero crossing of the corresponding curves respectively corresponds to the zero-crossing temperature, which, for example, for ULE™ lies at approximately T=30° C. If, as a result of a suitably chosen combination of the heating power coupled in by way of the heat emitter 130 and the cooling power set by way of the cooling element 120, the region of the mirror substrate 102 in the vicinity of the optically effective surface 101 is at this zero-crossing temperature, optical loads caused by the electromagnetic radiation impinging on the optically effective surface 101 during the operation of the projection exposure apparatus do not result in any deformation, since the coefficient of linear expansion of the mirror substrate material is equal to zero. Conversely, according to FIG. 3, when there is a deviation from this temperature, there is an increasing sensitivity of the respective mirror substrate material to temperature changes, which can be used for the thermal actuation or deformation of the mirror 100 that is described above.

A further embodiment of the invention is explained below with reference to FIGS. 4a-4b, components that are analogous or have substantially the same function as in FIG. 2 being designated by corresponding reference numerals increased by "100".

Figure 4A:
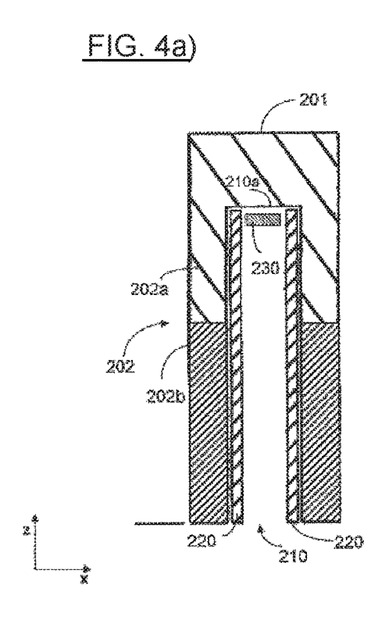
FIGS. 4a-4b show schematic representations for explaining the structure of an arrangement according to the invention for the thermal actuation of a mirror in a further exemplary embodiment of the invention.
Figure 4B:
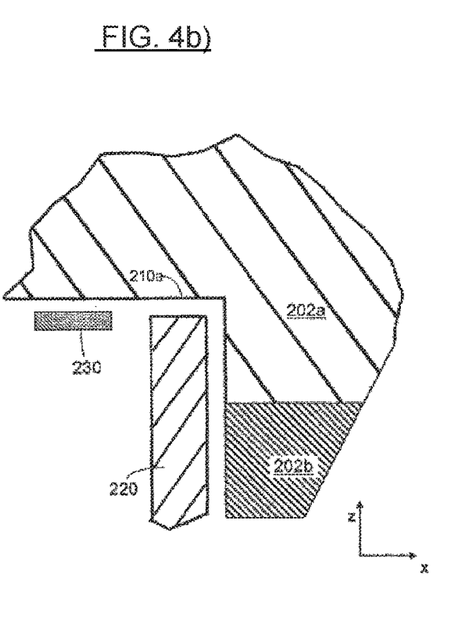

The embodiment according to FIGS. 4a-4b differs from that according to FIG. 2 in that the mirror substrate 202 is produced from two different mirror substrate materials, the mirror 200 is therefore formed as a "composite mirror". In fact, the mirror substrate 202 has a first mirror substrate region 202a and a second mirror substrate region 202b, which is more remote in relation thereto from the optically effective surface 201 of the mirror 200, the mirror substrate regions 202a, 202b being produced from different materials. In the actual exemplary embodiment, the mirror substrate material of the first mirror substrate region is ULE™ and the mirror substrate material of the second mirror substrate region 202b is quartz glass ($SiO_2$). However, the invention is not restricted to these materials, so that in further embodiments the mirror substrate regions 202a, 202b may also be produced from different mirror substrate materials, the mirror substrate material in the second mirror substrate region 202b in each case having a coefficient of linear expansion that is greater in terms of the absolute amount at a prescribed temperature than the mirror substrate material in the first mirror substrate region.

As a result of this configuration in the exemplary embodiment of FIGS. 4a-4b, the desired greater sensitivity of the mirror substrate material that is described above and is desired for the purpose of specific deformation is obtained in the region more remote from the optically effective surface 201 not only because of the temperature gradient forming within the mirror substrate material but also because of the transition between different mirror substrate materials, so that the embodiment according to FIGS. 4a-4b are suitable in particular in situations in which the temperature gradient alone is not yet sufficient to achieve the sensitivity to thermal loads desired for the deformation while at the same time maintaining the zero-crossing temperature at the optically effective surface.

Figure 5A:
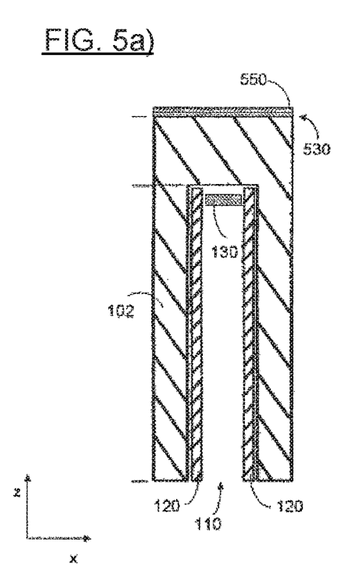
FIGS. 5a-5b show schematic representations of further embodiments of the invention.
Figure 5B:
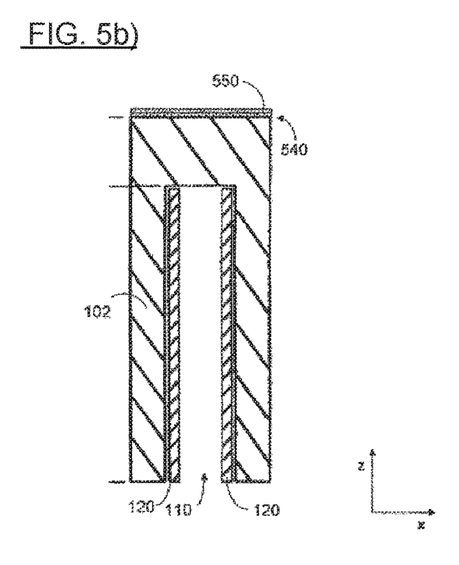

FIGS. 5a and 5b serve for explaining further embodiments of the invention. According to FIG. 5a, an absorbent layer 530 for the at least partial absorption of the heating radiation that is coupled into the access channel 110 is arranged between the mirror substrate 102 and the reflective coating 550. According to FIG. 5b, instead of the heat emitter 130 that is present in the embodiments described above, an arrangement 540 of heating wires is provided as the heat source, by which the region between the mirror substrate 102 and the reflective coating 550 can be heated directly with heating power that can be set variably.

Figure 6:
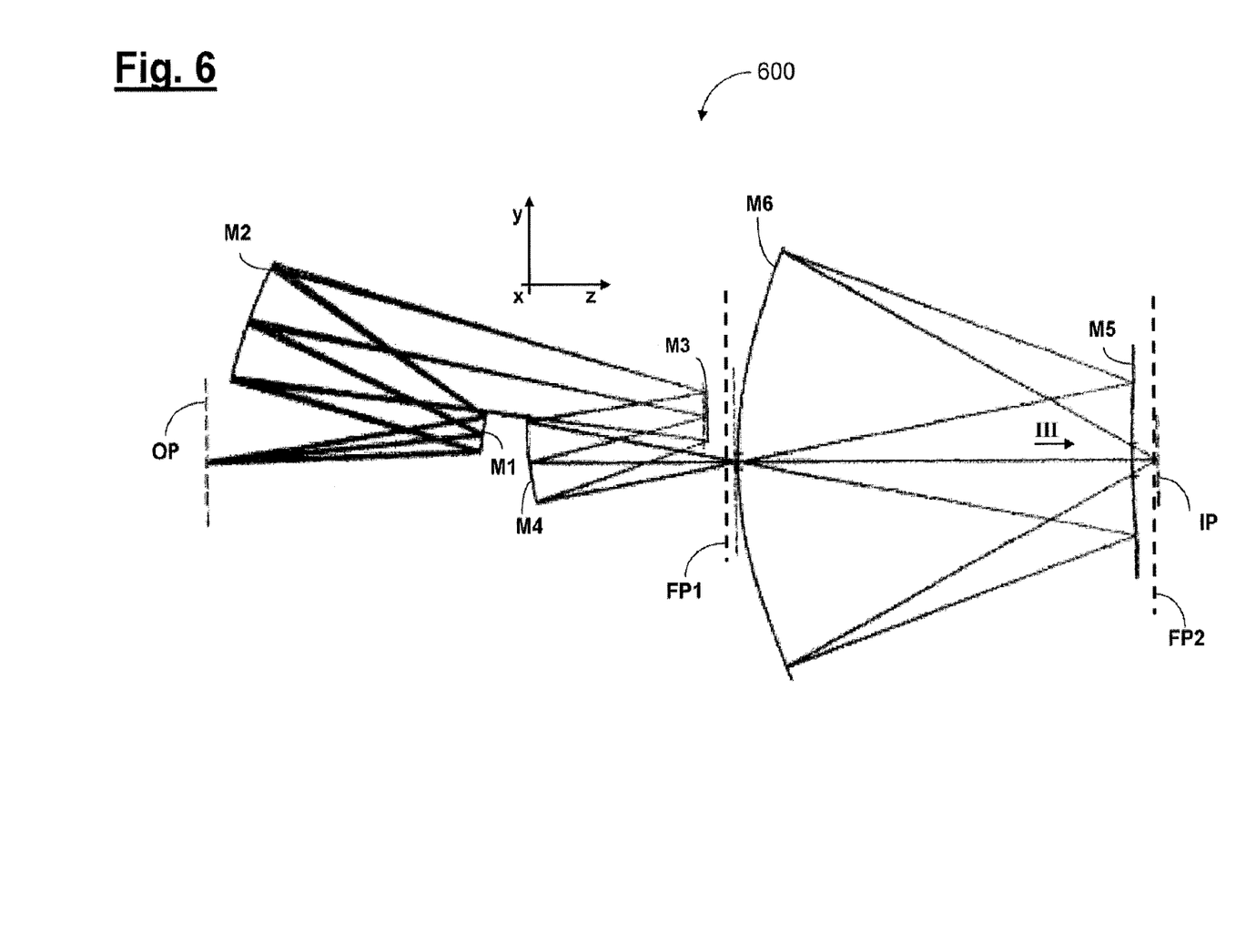
FIG. 6 shows a schematic representation of a projection lens of a microlithographic projection exposure apparatus designed for operation in EUV, in which the invention can be realized for example.

An arrangement according to the invention for the thermal actuation of a mirror may be used both in conjunction with a mirror in the illumination device and in conjunction with a mirror in the projection lens of a microlithographic projection exposure apparatus. FIG. 6 shows merely as an example of an application the path of rays of a projection lens 600, which is disclosed in US 2008/0170310 A1 (see FIG. 2 there). The projection lens 500 is designed for operation in EUV and has six mirrors M1 to M6. In this case, for example, the mirrors M2 and M6 that are respectively close to the pupil or else another of the mirrors according to one of the embodiments described above may be configured as thermally actuable.

Even though the invention has been described on the basis of specific embodiments, numerous variations and alternative embodiments are evident to a person skilled in the art, for example by combining and/or exchanging features of individual embodiments. Accordingly, it goes without saying for a person skilled in the art that such variations and alternative embodiments are also covered by the present invention, and the scope of the invention is only restricted by the constraints of the accompanying patent claims and the equivalents thereof.

The invention claimed is:

1. An arrangement, comprising:
   a mirror comprising a mirror substrate, a first surface which is an optically effective surface, a second surface which is different from the first surface, and an access channel which extends from the second surface toward the first surface;
   a cooling element which variably protrudes into the access channel; and
   a heat source configured to variably couple heating power into a region of the mirror substrate that adjoins the first surface,
   wherein the arrangement is configured so that, during use of the arrangement:
   the cooling element does not contact the heat source;
   a cooling power of the cooling element and a heating power of the heat source are set to achieve a thermal flux between the first and second surfaces; and
   the thermal flux results in a temperature gradient and a related local variation of a value of a coefficient of thermal expansion in the mirror substrate.

2. The arrangement of claim 1, wherein the mirror comprises a plurality of access channels, and each access channel extends from the second surface toward the first surface.

3. The arrangement of claim 2, further comprising a plurality of cooling elements, wherein each cooling element variably protrudes into a corresponding access channel.

4. The arrangement of claim 3, wherein the arrangement is configured so that a cooling power of each cooling elements is independently settable.

5. The arrangement of claim 2, wherein the heat source comprises a plurality of heat emitters, and each access channel has a corresponding heat emitter.

6. The arrangement of claim 5, wherein the arrangement is configured so that a heating power of each heat emitter is independently settable.

7. The arrangement of claim 1, wherein the heat emitter is arranged at an end portion of the access channel which faces the first surface.

8. The arrangement of claim 1, wherein the cooling element is tubular.

9. The arrangement of claim 1, wherein the heat source comprises a heat emitters configured so that, during use of the arrangement, the heat emitters couple heating radiation into the access channel.

10. The arrangement of claim 9, wherein the heating radiation has a wavelength of at least 2.5 µm.

11. The arrangement of claim 1, wherein:
the mirror comprises a reflective coating;
the heat source comprises a member selected from the group consisting of a heating wire and a heat-dissipating conductor track; and
the member is between the substrate and the reflective coating.

12. The arrangement of claim 1, wherein the second surface is opposite the first surface.

13. The arrangement of claim 1 wherein:
the mirror comprises a first mirror substrate region comprising a first mirror substrate material;
the mirror comprises a second mirror substrate region comprising a second mirror substrate material;
the second mirror substrate material is different from the first mirror substrate material;
the first mirror substrate region is a first distance from the first surface;
the second mirror substrate region is a second distance from the first surface; and
the second distance is greater than the first distance.

14. The arrangement of claim 13, wherein, at a temperature, an absolute value of a coefficient of linear expansion of the first mirror substrate material is less than an absolute value of a coefficient of linear expansion of the second mirror substrate material.

15. The arrangement of claim 13, wherein the first mirror substrate material comprises an ultra-low expansion material.

16. The arrangement of claim 13, wherein the second mirror substrate material comprises quartz.

17. The arrangement of claim 1, wherein the arrangement is configured so that, during use of the arrangement, a deformation profile of the mirror is producible by varying at least one member selected from the group consisting of the heating power of the heat source and the cooling power of the cooling element.

18. The arrangement of claim 1, wherein the arrangement is configured so that, during use of the arrangement, varying a temperature variation in a region of the substrate facing away from the first surface deforms the region of the substrate facing away from the first, and the deformation is mechanically transferred to the first surface.

19. The arrangement of claim 1, wherein the mirror comprises a reflective material and an absorbent layer, the absorbent layer is configured to absorb heating radiation coupled into the access channel, and the absorbent layer is between the substrate and the reflective material.

20. An apparatus, comprising:
an arrangement according to claim 1,
wherein the apparatus is a microlithographic projection exposure apparatus.

21. A method of thermally actuating a mirror of a microlithographic projection exposure apparatus, the mirror comprising a substrate, a first surface which is an optically effective surface, a second surface which is different from the first surface, an access channel extending from the second surface toward the first surface, the method comprising:
coupling heating power into a region of the substrate using a heat source;
defining a deformation profile of the mirror by varying the heating power to substrate and/or varying the cooling power of a cooling element protruding into the access channel so that a temperature of the mirror in a region of the first surface is kept constant to within ±3 K,
wherein the cooling element does not contact the heat source.

22. The method of claim 21, wherein the constant value corresponds to the zero-crossing temperature of the mirror substrate material in the region concerned.

23. The method of claim 21, wherein the temperature of the mirror is in the range of 22° C. to 55° C.

24. The method of claim 21, wherein varying the heating power of the heat source comprises at least partially compensating a heat input into the first surface caused by optical loads during use of the projection exposure apparatus.

25. The method of claim 21, comprising setting the cooling power of the cooling element and the heating power to achieve a thermal flux between the first and second surfaces, wherein the thermal flux results in a temperature gradient and a related local variation of a value of the coefficient of thermal expansion in the substrate.

26. The method of claim 25, wherein the local variation is such that the coefficient of thermal expansion in the substrate increases in a direction from the first surface to the second surface.

27. The method of claim 21, comprising varying a temperature in a region of the substrate facing away from the first surface to deform the region of the substrate facing away from the first surface, wherein the deformation is mechanically transferred to the first surface.

* * * * *

UNITED STATES PATENT AND TRADEMARK OFFICE
CERTIFICATE OF CORRECTION

| | | |
|---|---|---|
| PATENT NO. | : 9,798,254 B2 | Page 1 of 1 |
| APPLICATION NO. | : 14/848593 | |
| DATED | : October 24, 2017 | |
| INVENTOR(S) | : Markus Hauf | |

It is certified that error appears in the above-identified patent and that said Letters Patent is hereby corrected as shown below:

On the Title Page

Page 2, Column 2, Line 6 item (56) under "OTHER PUBLICATIONS", delete "Patentabililty" and insert -- Patentability --.

In the Specification

Column 6, Line 25, delete "FIG." and insert -- FIGS. --.

Column 6, Line 34, delete "FIG." and insert -- FIGS. --.

Column 6, Line 56, delete "FIG." and insert -- FIGS. --.

Column 7, Line 15, delete "FIG." and insert -- FIGS. --.

Column 7, Line 42, delete "FIG." and insert -- FIGS. --.

Column 8, Line 42, delete "FIG." and insert -- FIGS. --.

Signed and Sealed this
Sixth Day of March, 2018

Andrei Iancu
*Director of the United States Patent and Trademark Office*